United States Patent
Chua et al.

(10) Patent No.: US 10,723,112 B2
(45) Date of Patent: Jul. 28, 2020

(54) METHOD OF TRANSFERRING THIN FILM

(75) Inventors: Lay-Lay Chua, Singapore (SG); Peter Ho, Singapore (SG); Rui-Qi Png, Singapore (SG); Fong Yu Kam, Singapore (SG); Jie Song, Singapore (SG); Loke-Yuen Wong, Singapore (SG); Jing-Mei Zhuo, Singapore (SG); Kian Ping Loh, Singapore (SG); Geok Kieng Lim, Singapore (SG)

(73) Assignee: National University of Singapore, Singapore (SG)

(*) Notice: Subject to any disclaimer, the term of this patent is extended or adjusted under 35 U.S.C. 154(b) by 564 days.

(21) Appl. No.: 14/119,830

(22) PCT Filed: May 23, 2012

(86) PCT No.: PCT/SG2012/000182
§ 371 (c)(1),
(2), (4) Date: Nov. 22, 2013

(87) PCT Pub. No.: WO2012/161660
PCT Pub. Date: Nov. 29, 2012

(65) Prior Publication Data
US 2014/0087191 A1    Mar. 27, 2014

Related U.S. Application Data

(60) Provisional application No. 61/489,021, filed on May 23, 2011.

(51) Int. Cl.
*B23B 37/00* (2006.01)
*B32B 37/00* (2006.01)
*H01L 21/20* (2006.01)

(52) U.S. Cl.
CPC ........ *B32B 37/025* (2013.01); *H01L 21/2007* (2013.01); *Y10T 428/30* (2015.01)

(58) Field of Classification Search
CPC . H01L 21/2007; B32B 37/025; Y10T 428/30; Y10T 29/49147; Y10T 29/49124; Y10T 29/49117; Y10T 29/49002
(Continued)

(56) References Cited

U.S. PATENT DOCUMENTS 7,456,059 B2    11/2008  Kodaira
8,878,162 B2 *  11/2014  Bradley ............... B82Y 10/00
                                                        257/40
(Continued)

FOREIGN PATENT DOCUMENTS

JP      2010143103        7/2010
WO  WO-2008093090 A2 *   8/2008  ............ B82Y 40/00
WO      2012161660 A1   11/2012

OTHER PUBLICATIONS

Sakulsuk Applied Physics Letters, vol. 95,202101(2009).*
Younan, Chem Rev. 1999, 99, 1823-1848.*
(Continued)

*Primary Examiner* — Peter Dungba Vo
*Assistant Examiner* — Azm A Parvez

(57) ABSTRACT

The present invention discloses a method for transferring a thin film from a first substrate to a second substrate comprising the steps of: providing a transfer structure and a thin film provided on a surface of a first substrate, the transfer structure comprising a support layer and a film contact layer, wherein the transfer structure contacts the thin film; removing the first substrate to obtain the transfer structure with the thin film in contact with the film contact layer; contacting the transfer structure obtained with a surface of a second substrate; and removing the film contact layer, thereby transferring the thin film onto the surface of the second substrate.

19 Claims, 9 Drawing Sheets

(58) Field of Classification Search
USPC .............. 29/842, 829, 825, 592.1; 156/249; 428/408
See application file for complete search history.

(56) References Cited

U.S. PATENT DOCUMENTS

| | | | |
|---|---|---|---|
| 2004/0121568 A1* | 6/2004 | Kim | H01L 51/0004 438/584 |
| 2007/0287242 A1 | 12/2007 | Kodaira et al. | |
| 2008/0083484 A1* | 4/2008 | Blanchet | B82Y 10/00 156/234 |
| 2009/0199960 A1* | 8/2009 | Nuzzo | B82Y 10/00 156/230 |
| 2010/0051178 A1* | 3/2010 | Lee | B32B 37/025 156/152 |
| 2010/0051191 A1 | 3/2010 | Lee et al. | |
| 2010/0052112 A1* | 3/2010 | Rogers | B81B 7/0093 257/625 |
| 2010/0317132 A1* | 12/2010 | Rogers | H01L 33/54 438/27 |
| 2010/0323164 A1* | 12/2010 | Ogihara | H01L 21/2007 428/156 |
| 2011/0048625 A1 | 3/2011 | Caldwell et al. | |

OTHER PUBLICATIONS

Extended European Search Report dated Oct. 20, 2014, European Application No. 12788925.1-1555.
Foreign Communication from a Related Counterpart Application, International Preliminary Report on Patentability dated Dec. 5, 2013, International Application No. PCT/SG2012/000182 filed on May 23, 2011 6pgs.
Unarunotai, Sakulsuk. et al., Transfer of graphene layers grown on SiC wafers to other substrates and their integration into filed effect transisitors, Applied Physics Letter 95, 2009, AIP Publishing.
Chua, Lay-Lay, et al., "Method of Transferring Material Films", filed May 23, 2011, U.S. Appl. No. 61/489,021.
Foreign Communication from a Related Counterpart Application, "International Search Report and Written Opinion" dated Aug. 15, 2013. International Application No. PCT/SG2012/000182 filed on May 23, 2012.
Li, Xuesong, et al., "Large-Area Synthesis of High-Quality and Uniform Graphene Films on Copper Foils", Science vol. 324, 1312-1314, Jun. 5, 2009.
Li, Xuesong, et al., "Synthesis, Characterization, and Properties of Large-Area Graphene Films", ECS Transactions vol. 19 (5) p. 41-52, 2009.
Liang, Xiaogan, et al., "Graphene Transistors Fabricated via Transfer-Printing in Device Active-Areas on Large Wafer", Nano Letters, vol. 7, No. 12, p. 3840-3844, 2007.
Bae, Sukang, et al., "Roll-to-roll production of 30-inch graphene films for transparent electrodes", Nature NanoTechnology, Letters, Jun. 20, 2010.
Yan, Chao, et al., "Mechanical and Environmental Stability of Polymer Thin-Film-Coated Graphene", ACS Nano, vol. 6, No. 3, 2012.
Song, Li, et al., "Transfer Printing of Graphene Using Gold Film", ACS Nano, vol. 3, No. 6, 2009.
Unarunotai, Sakulsuk, et al., "Transfer of graphen layers grown on SiC wafers to other substrates and their integration into field effect transistors", Applied Physics Letters 95, 202101, 2009.
Unarunotai, Sakulsuk, et al., "Layer-by-Layer Transfer of Multiple Large Area Sheets of Graphene Grown in Multilayer Stacks on a Single SiC Wafer", ACS Nano, vol. 4, No. 10, 2010.
Caldwell, Joshua D., et al., "Technique for the Dry Transfer of Epitaxial Graphene onto Arbitrary Substrates", ACS Nano, vol. 4, No. 2, 2010.
Caldwell, Joshua D., et al., "Epitaxial Graphene: Dry Transfer and Materials Characterization", Carbon Nanotubes, Graphene and Associated Devices III, SPIE vol. 7761, 77610N, 2010.
Allen, Matthew J., et al., "Soft Transfer Printing of Chemically Converted Graphene", Advanced Materials, vol. 21, 2009.
Li, Xuesong, et al., "Transfer of Large-Area Graphene Films for High-Performance Transparent Conductive Electrodes", Nano Letters, vol. 9, No. 12, 2009.
Reina, Alfonso, et al., "Large Area, Few-Layer Graphene Films on Arbitrary Substrates by Chemical Vapor Deposition", Nano Letters, vol. 9, No. 1, 2009.
Reina, Alfonso, et al., "Transferring and Identification of Single-and Few-Layer Graphene on Arbitrary Substrates", Journal of Physical Chemistry Letters, vol. 112, 2008.
Foreign Communication From a Related Counterpart Application, Chinese Office Action dated Apr. 15, 2016, Chinese Application No. 201280031744.9.
Foreign Communication From a Related Counterpart Application, Japan Office Action dated May 12, 2016, Japan Application No. 2014-512797.
Xiaogan Liang, Nanoletters, 7(12): 3840-3844, 2007.
Allen, Matthew J., Advanced Materials, 21(20): 2098-2102, 2009.
Foreign Communication From a Related Counterpart Application, Chinese Office Action dated Sep. 6, 2017, Chinese Application No. 201280031744.9.

* cited by examiner

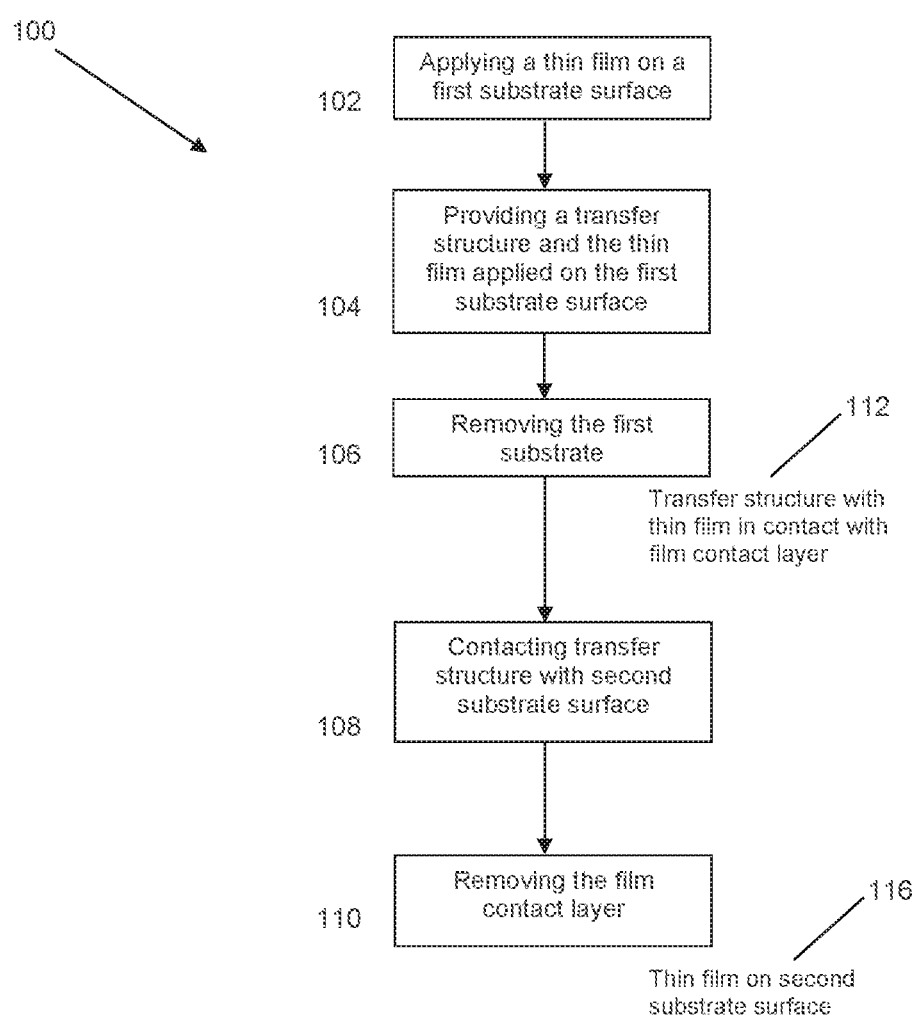

METHOD OF TRANSFERRING THIN FILM

CROSS-REFERENCE TO RELATED APPLICATIONS

This application is a filing under 35 U.S.C. 371 as the National Stage of International Application No. PCT/SG2012/000182, filed May 23, 2012, entitled "METHOD OF TRANSFERRING THIN FILMS", which claims the benefit of and priority to U.S. Provisional Patent Application No. 61/489,021, filed May 23, 2011 and entitled "METHOD OF TRANSFERRING THIN FILMS", both of which are incorporated herein by reference in their entirety for all purposes.

FIELD OF THE INVENTION

The present invention relates to a method of transferring thin film. In particular, the method is for transferring thin films from one substrate to another.

BACKGROUND OF THE INVENTION

Graphene and other layered material such as boron nitride (BN) comprise two-dimensional sheets of atoms or ions bound together in which the effective thickness of the sheet is in the order of atomic or molecular thicknesses (usually less than 2 nm), which is far smaller than the lateral dimensions of the order of micrometers up to centimeters. These and other thin-film materials such as thin Si layers, InGaAs, copper-indium-gallium-arsenide layers, have numerous potential applications as the conductor, semiconductor or insulator in electronic, optoelectronic, optical, sensor and thermal devices, and for mechanical strength and toughness applications, for storage, or for surface-modifying applications including sensors.

A key processing challenge to the development of a number of these practical applications however is the lack of a suitable method to pattern and transfer these films from their growth substrate to the target substrate, in a way that is reliable, robust, and suitable for manufacturing without damaging the properties of the transferred film. This is particularly challenging because the thin films are often in the single or few atomic sheet form, and are hence very fragile.

X. S. Li et al (Science 2009, 324:1312; ECS Transactions, 2009, 19:41) described one method in which a copper (Cu) growth substrate is etched away to release graphene onto the target substrate that is brought into contact with floating graphene in the etchant solution. This method does not provide for any possibility to register the transferred sheet to the target substrate. It also greatly limits applications because the target substrate may not be compatible with the etchant solution, which may further be a source of contamination.

X. Liang et al (Nano Lett. 2007, 7:3840) described the use of a thermal-release (TR) glue layer based on a resinous material that acts as a room-temperature glue to the graphene sheet together with a hard stamp made of silicon, to extract multilayer graphene sheets from a HOPG crystal, and deposit onto another thermal-curable glue layer or hydrophilic silicon oxide surface. Because it uses a glue layer to attach the graphene to the silicon stamp, the transfer of graphene to the target substrate depends crucially on the relative strength of adhesion to the target vs. the TR glue at the release temperature. This requires typically a glue layer to also be present on the target or a high surface energy substrate (such as hydrophilic silicon oxide surfaces). This greatly limits the applicability of this method because the target surface may not generally have a glue layer or a strongly adhesive surface, particularly for electronic, semiconductor and insulator applications. Furthermore the glue layer may cause structural damage to the graphene and severely contaminate the surfaces of the transferred 2-d layered material. A similar method is disclosed by Bae S. et al (Nature Nanotech, 2010, 5:574; ACS Nano, 2011, 6:2096), which also employs the thermal release tape as the support and transfer material and the process is carried out via a roll-to-roll method.

L. Song et al (ACS Nano 2009, 3:1353) described the use of gold as an adhesion layer to the patterned graphene film, and a thermal-release (TR) tape as the pressure-sensitive adhesive to adhere to the gold film to lift the gold/graphene composite film off the substrate. The assembly is then contacted onto the desired target substrate, and heated to the release temperature of the TR tape to release the gold/graphene composite film onto the target substrate. The gold is then attached off by standard potassium iodide etchant. This approach relies on strong adhesion between the target substrate and the graphene to successfully compete with the TR tape for the graphene, and requires a glue layer or a high energy surface to be present at the desired target substrate. In addition, the use of gold (or other metal) as the adhesion layer to transfer graphene causes general incompatibility with substrates that cannot tolerate gold (or other metal) etchants.

Similarly, S. Unarunotai et al (Appl. Phys. Lett. 2009, 95:202101; ACS Nano, 2010, 4:5591) described the use of gold and other metal films as an adherent layer on graphene to adhere to a pressure-sensitive polyimide tape. The entire assembly is then peeled off the substrate and laid on a target substrate. The polyimide tape is then etched off in oxygen plasma and the gold film etched off in a gold etchant. Such a peeling method would cause severe deformation and fracturing of the graphene film as revealed by the intensity of the defect band in Raman spectroscopy.

J. D. Caldwell et al (ACS Nano, 2010, 4:1108) also employs a related competitive adhesion approach by exfoliating graphene film from SiC using a thermal release tape. This transfer method leaves behind small areas of graphene on SiC surface because of poor conformal contact with the thermal release tape. An improvement of this method is also described (Carbon Nanotubes, Graphene, and Associated Devices Hi, Vol. 7761 (Eds: D. Pribat, Y. H. Lee, M. Razeghi), Spie-Int Soc Optical Engineering, Bellingham 2010) in which a poly(methyl methacrylate) (PMMA) layer is introduced between the thermal release tape and graphene. However, this method still relies on achieving a stronger adhesion of graphene to the target substrate than the thermal release tape.

M. J. Allen et al (Adv. Mater. 2009, 21:2098) describe the use of a poly(dimethylsiloxane) (PDMS) stamp to pick up graphene oxide sheets and few-layer graphenes (FLG) respectively deposited on a first substrate, to transfer to a second substrate. The transferred film quality via such direct physical exfoliation is poor and unreliable as evident by the optical images in that report. The two key problems in this method are that (i) the PDMS stamp does not have high affinity for the graphene sheets, and (ii) the graphene sheets that do adhere to the PDMS stamp may not transfer off to the target substrate if the adhesion between the graphene and the target is not high enough.

X. S. Li et al (Nano Lett. 2009, 9:435), X. S. Li et al (Science, 2009, 324:1312) and A. Reina et al (The Journal of Physical Chemistry C, 2008, 112:17741; Nano Letters, 2009, 9:30) use a polymer film of poly(methylmethacrylate) (PMMA) to act as a "carrier" film for the graphene sheet when the growth substrate is etched off. The PMMA/ graphene composite film is then laid onto the target substrate and PMMA dissolved in acetone to transfer the graphene film. The chief disadvantage of this approach is that "carrier" film is fragile, and prone to warping, stretching or bending and wrinkling that causes micro-cracking and mechanical damage of the graphene sheet. Furthermore the inherent stress that is frozen in during the formation of the carrier film also causes deformation of the film (warping) which damages (fractures) the graphene film during transfer, thereby degrading its quality and limiting its application. Such methods would also not allow patterning underlying patterns on the target substrate. If patterned films are desired, these would have to be separately defined, and the carrier film method does not provide any possibility of accurate patterning on the target substrate.

It is clear that the above methods depend on having a first adhesive layer that adheres to the graphene sheet as a stamp or a carrier sheet, and achieves transfer to the target substrate by making the target surface even more strongly adhesive such as through the use of a second adhesive layer. This imposes stringent requirements on the nature of the substrate. Further, the use of adhesives may not be compatible with most applications in electronics and semiconductors, and further, the methods do not provide allowance of patterning a substrate.

The methods of the state of the art typically damage the thin film sheets by stress/strain during transfer due to warping, stretching or bending of the carrier film, and also allow contamination by the adhesion (glue) layer that cannot be generally removed, because the transferred graphene or thin film sheets cannot be subjected to harsh cleaning processes without damage. Moreover, some of the transfer methods require the use of a final chemical etching and/or cleaning step to remove the first adhesion layer which further limits the general compatibility with a number of substrates and manufacturing processes. The use of thermal-release tapes also inevitably causes stretching deformation and fracture of the attached thin film, and is inherently incompatible with accurate placement of patterned films on the target substrate. In addition, none of these transfer processes permits the simultaneous patterning of the 2-d thin films.

There is therefore a need for an improved process to transfer thin films from one substrate to another.

SUMMARY OF THE INVENTION

The present invention seeks to address at least one of the problems in the prior art, and provides a method of transferring a thin film from its growth substrate to a target substrate.

According to a first aspect, there is provided a method of transferring a thin film from a first substrate to a second substrate comprising the step of:
(a) providing a transfer structure and a thin film provided on a surface of a first substrate, the transfer structure comprising a support layer and a film contact layer, wherein the transfer structure contacts the thin film;
(b) removing the first substrate to obtain the transfer structure with the thin film in contact with the film contact layer;
(c) contacting the transfer structure obtained in the step (b) with a surface of a second substrate; and
(d) removing the film contact layer, thereby transferring the thin film onto the surface of the second substrate.

The thin film may be any suitable thin film for the purposes of the present invention. For example, the thin film may be selected from, but not limited to, graphene, boron nitride (BN), molybdenum disulfide ($MoS_2$), molybdenum-sulphur-iodine (MoSI), molybdenum (V) telluride ($MoTe_2$), niobium (IV) telluride ($NbTe_2$), nickel selenide ($NiSe_2$), tungsten disulfide ($WS_2$), copper (Cu), gold (Au), silver (Ag), platinum (Pt), palladium (Pd), silicon (Si), gallium arsenide (GaAs), indium gallium arsenide (InGaAs), copper indium gallium arsenide (CIGS), yttrium barium copper oxide (YBCO), strontium titanate ($SrTiO_3$), cadmium telluride (CdTe), gallium indium phosphide (GaInP), alumina ($Al_2O_3$), or combinations thereof.

According to a particular aspect, the thin film may be a film having a thickness of an atomic or molecular layer. In particular, the thin film may be a graphene film.

The thin film may be provided on the surface of the first substrate by any suitable method. For example, the thin film may be provided on the surface of the first substrate by, but not limited to, electrospinning, spin coating, plating, chemical solution deposition, chemical vapour deposition, plasma-enhanced chemical vapour deposition, atomic layer deposition, thermal evaporation, electron beam evaporation, molecular beam epitaxy, sputtering, pulsed laser deposition, cathodic arc deposition, electrohydrodynamic deposition, inkjet printing, aerosol spraying, dip coating, drop casting, physical vapour deposition, vacuum sublimation, doctor blading, or a combination thereof.

The thin film may be patterned or unpatterned. According to a particular aspect, the method may further comprise a step of patterning the thin film before or after the providing of step (a) to obtain a patterned thin film.

The support layer comprised in the transfer structure may be any suitable support layer which provides adequate support for the thin film during the transfer of the thin film from the surface of the first substrate to the surface of the second substrate while the thin film is in contact with the film contact layer. Accordingly, the support layer may be of any suitable material to provide the necessary support for the thin film. According to a particular aspect, the support layer may comprise an elastomer. For example, the elastomer may be selected from, but not limited to, poly(dimethylsiloxane), polyurethane, butadiene-acrylonitrile copolymer, perfluoroalkoxy polymers, polyethylene, poly(ethyl acrylate), polyisoprene, polybutadiene, polychloropene, or combinations thereof.

The support layer may be of a suitable thickness. In particular, the support layer may have a thickness of 100 µm-10 mm.

The film contact layer comprised in the transfer structure may be of any suitable material for the purposes of the present invention. According to a particular aspect, the film contact layer may comprise a polymer. For example, the polymer may be, but not limited to, polystyrene, polycarbonate, poly(methyl methacrylate), polydimethylsiloxane, polyisobutylene, divinylsiloxane-bis-benzocyclobutene resin, poly(styrene sulfonic acid), polyacrylic acid, poly (allylamine hydrochloride), polyimide, copolymers of tetrafluoroethylene and 2,2-bistrifluoromethyl-4,5-difluoro-1,3-dioxiole, fluorinated methacrylate polymers, fluoroacrylate polymers, perfluoro(1-butenyl vinyl ether)homocopolymer, or a combination thereof.

According to a particular aspect, the contact of the thin film with the film contact layer in the step (b) may be by van der Waals interaction. Accordingly, the film contact layer should preferably be of a suitable thickness. For example, the film contact layer may have a thickness of about 10-5000 nm.

The first substrate may be any suitable substrate. In particular, the first substrate may be any suitable substrate on which the thin film may be applied.

The second substrate may be any suitable substrate. In particular, the second substrate may be comprised in a thin film device. The thin film device may be any suitable device. For example, the thin film device may be an electronic, optoelectronic, optical sensor, or thermal device. In particular, the thin film device may be, but not limited to, a thin film transistor, a solar battery, a light emitting diode, a solar cell, or a bio-sensor.

The second substrate may be a rigid or flexible substrate. The second substrate may be patterned or unpatterned.

According to a particular aspect, the contacting of the step (c) may comprise applying a pressure of 0.01-8 bar on the transfer structure.

According to a particular aspect, the support layer of the transfer structure may be released before or during the removing of the step (d).

According to a second aspect, the present invention provides a device comprising a substrate having a thin film transferred onto a surface of the substrate according to the method described above.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings. In the drawings:

FIG. 1(A) is a flow chart showing the general method of transferring thin films according to the present invention;

DETAILED DESCRIPTION OF THE INVENTION

Figure 1B:
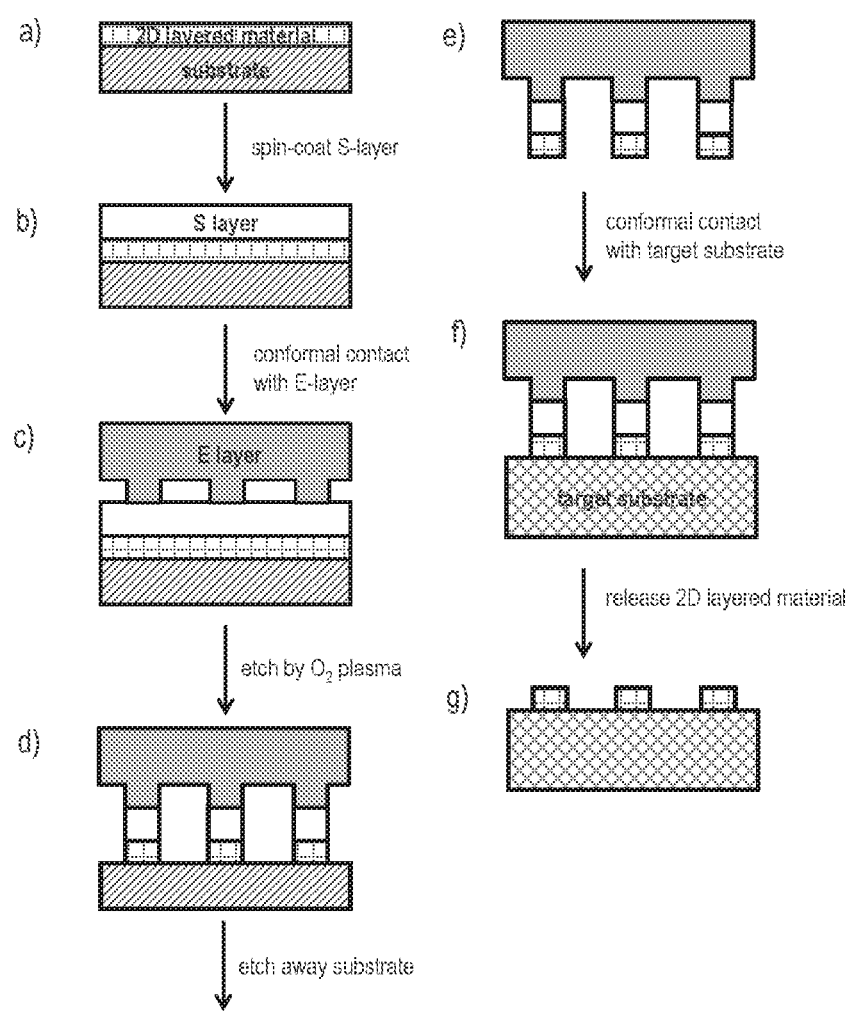
FIG. 1(B) is a schematic representation of a particular embodiment of the present invention.

The exemplary embodiments aim to provide a simple method of transferring thin films from a substrate on which they are initially deposited to a target substrate. The target substrate may be comprised in a thin film device. The method of the present invention provides a reliable, robust and scalable method to transfer thin films. In particular, the method of the present invention does not use adhesive layers. Accordingly, the method of the present invention avoids the problems associated with the use of such adhesive layers in which the method of transferring the thin films may depend on the competition of adhesive layers in order to transfer the thin film from one substrate to another. The method of the present invention also allows patterning of the thin film.

According to a first aspect, there is provided a method for transferring a thin film from a first substrate to a second substrate comprising the steps of:

(a) providing a transfer structure and a thin film provided on a surface of a first substrate, the transfer structure comprising a support layer and a film contact layer, wherein the transfer structure contacts the thin film;

(b) removing the first substrate to obtain the transfer structure with the thin film in contact with the film contact layer;

(c) contacting the transfer structure obtained in the step (b) with a surface of a second substrate; and (d) removing the film contact layer.

A method 100 for transferring a thin film from one substrate to another substrate may generally comprise the steps as shown in FIG. 1(A). Each of these steps will now be described in more detail.

Step 102 comprises applying a thin film on a surface of a first substrate. For the purposes of the present invention, a thin film may encompass a film having a thickness of an atomic, molecular, or ionic layer. A thin film according to the present invention may also encompass a plurality of stacked films with each film having a thickness of one atom, molecule, or ion.

According to a particular embodiment, the thickness of the thin film on the surface of the first substrate may be 0.1-100 nm, 0.5-80 nm, 1-70 nm, 2-60 nm, 3-50 nm, 4-40 nm, 5-30 nm, 6-20 nm, 7-10 nm. In particular, the thickness of the thin film on the surface of the first substrate may be 0.1-1 nm.

The thin film applied on the surface of the first substrate may be any suitable thin film. For example, the thin film may be selected from, but not limited to, graphene, boron nitride (BN), molybdenum disulfide ($MoS_2$), molybdenum-sulphur-iodine (MoSI), molybdenum (V) telluride ($MoTe_2$), niobium (IV) telluride ($NbTe_2$), nickel selenide ($NiSe_2$), tungsten disulfide ($WS_2$), or a combination thereof. The thin film may also be an ultrathin film of metallic, covalent or ionic materials such as that of copper (Cu), gold (Au), silver (Ag), platinum (Pt), palladium (Pd), silicon (Si), gallium arsenide (GaAs), indium gallium arsenide (InGaAs), copper indium gallium arsenide (CIGS), yttrium barium copper oxide (YBCO), strontium titanate ($SrTiO_3$), cadmium telluride (CdTe), gallium indium phosphide (GaInP), alumina ($Al_2O_3$), or combinations thereof. In particular, the thin film may be a graphene film.

The first substrate may be any suitable substrate. For example, the first substrate may be any suitable substrate on which the thin film is deposited or grown. The selection of the first substrate may differ depending on the thin film to be deposited or grown. The first substrate may be a metal foil, a metal thin film on a support substrate, a semiconductor substrate or an ionic substrate. The first substrate may be, but not limited to, gallium-arsenic (GaAs), sapphire, quartz, glass, magnesium oxide (MgO), lanthanum aluminate ($LaAlO_3$), neodymium (III) gallate (NdGaOs), or zirconia. For example, when the thin film is graphene, the first substrate may be, but not limited to, copper, nickel, ruthenium, palladium, platinum, iridium, boron nitride, cobalt, or silicon carbide (SiC). If the thin film is aluminium nitride (AlN), the first substrate may be silicon (Si). If the thin film is molybdenum disulfide ($MoS_2$), the first substrate may be indium (II) selenide (InSe). If the thin film is gallium nitride (GaN), the first substrate may be silicon carbide (SiC). If the thin film is gallium arsenide (GaAs), the first substrate may be c-sapphire. In particular, a person skilled in the art would understand which substrate to use as a first substrate depending on the thin film to be transferred.

The thin film may be applied on a surface of the first substrate by any suitable method. For example, the thin film may be applied on the surface of the first substrate by, but not limited to, electrospinning, spin coating, plating, chemical solution deposition, chemical vapour deposition, plasma-enhanced chemical vapour deposition, atomic layer deposition, thermal evaporation, electron beam evaporation, molecular beam epitaxy, sputtering, pulsed laser deposition, cathodic arc deposition, electrohydrodynamic deposition, inkjet printing, aerosol spraying, dip coating, drop casting, physical vapour deposition, vacuum sublimation, doctor blading, or a combination thereof.

Once the thin film is applied on the surface of the first substrate, the thin film is contacted with a transfer structure. Accordingly, step 104 comprises providing a transfer structure and a thin film which has been provided on the surface of the first substrate, wherein the transfer structure contacts the thin film. The step 104 may comprise conformal contacting the transfer structure with the thin film applied on the surface of the first substrate. In particular, the step 104 may comprise physically contacting the transfer structure and the thin film on the surface of the first substrate at a molecular length scale such that there is no air or other gap separating the surface of the transfer structure and the thin film.

Figure 2A:
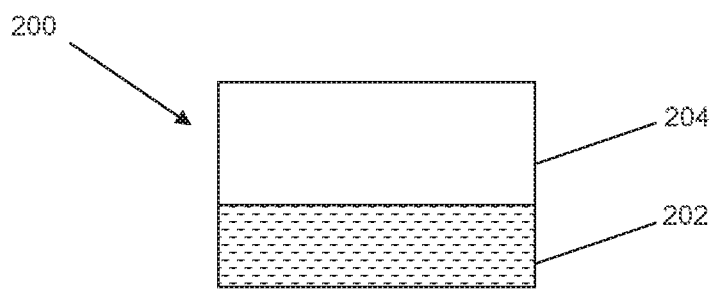
FIG. 2 is schematic representation of: (A) the transfer structure according to one embodiment of the present invention; and (B) the transfer structure in contact with the thin film according to one embodiment of the present invention.

The transfer structure comprises a film contact layer and a support layer. FIG. 2(A) shows a transfer structure 200 according to a particular embodiment of the present invention. In particular, the transfer structure 200 comprises a film contact layer 202 and a support layer 204. The transfer structure 200, the film contact layer 202 and the support layer 204 is described in more detail below.

Step 106 comprises removing the first substrate. The removing of the step 106 may comprise dissolving the first substrate in an etchant bath. Any suitable solvent may be used in the etchant bath for the purposes of the present invention. In particular, the solvent comprised in the etchant bath may be selected based on the first substrate. It would be immediately obvious to a person skilled in the art which solvent to select for the etchant bath. Examples of suitable solvents for use as an etchant bath may be found in CRC Handbook of Metal Etchant, Perrin Walker and William H Tan, 1991 (CRC Press, Boca Raton Fla., USA). The etchant bath may comprise a water-based or an organic-based solvent. For example, the etchant bath may comprise, but is not limited to, nitric acid ($HNO_3$), ferric chloride ($FeCl_3$), iron (III) nitrate ($FeNO_3$), ferric chloride with hydrochloric acid, ammonia persulfate [$(NH_4)_2S_2O_8$], or a combination thereof.

Figure 2B:
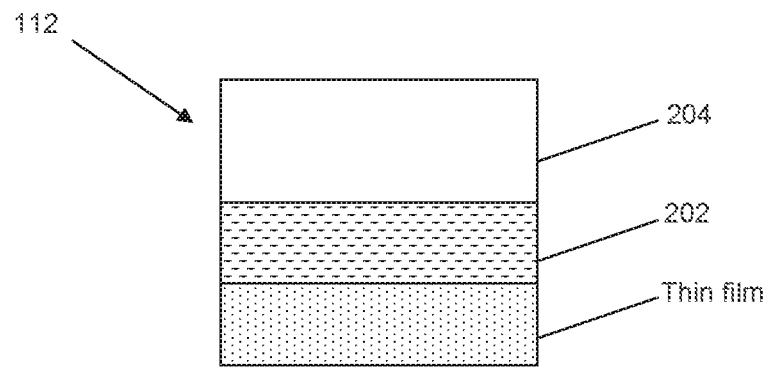

Once the first substrate is removed, for example by being dissolved or etched away, the thin film does not become free floating. Instead, thin film is in contact with the film contact layer of the transfer structure. Accordingly, a transfer structure with the thin film in contact with the film contact layer 112 is obtained, as shown in FIG. 2(B).

The transfer structure with the thin film in contact with the film contact layer 112 is then contacted with a surface of a second substrate according to step 108. The step 108 may comprise conformal contacting the transfer structure with the thin film in contact with the film contact layer 112 with a surface of a second substrate. In particular, the step 108 may comprise bringing the transfer structure with the thin film in contact with the film contact layer 112 into conformal contact at the precise desired location on the surface of the second substrate.

The second substrate may be any suitable substrate. The second substrate may be the target substrate. In particular, the second substrate may be the substrate to which the thin film is ultimately transferred to. The second substrate may be any substrate comprising an inorganic, polymeric, metal or semiconductor film. The second substrate may be unpatterned or patterned. Accordingly, the second substrate may comprise pre-patterned topographic, structural or electrical elements to which the transfer of the thin film is desired. The second substrate may be a plastic foil, metal foil, silicon, an inorganic semiconductor wafer, silicon oxide, fused silica, glass, aluminium oxide, indium-tin oxide. The second substrate may be an oxide or sulphide material. The second substrate may be a covalent or ionic solid. For example, the thin film device may be a thin film transistor, a solar battery, capacitor, light-emitting diode, or a bio-sensor. The second substrate may be a rigid substrate such as glass, silicon, or other oxide substrate, or a flexible substrate such as plastic or metal foils.

For example, the second substrate may be comprised in a thin film device. The thin film device may be any device in which a thin film is required. For example, the thin film device may be, but not limited to, an electronic, an optoelectronic, an optical sensor, a capacitor, an energy storage device, or a thermal device.

Prior to the contacting of the step 108, the surface of the second substrate onto which the thin film is to be transferred may be cleaned. Any suitable cleaning method may be used. In particular, the surface of the second substrate should be free from chemical and particulate contaminants.

During the contacting of the step 108, a small pressure may be applied to ensure conformal contact between the transfer structure 112 and the surface of the second substrate. For example, the contacting of the step 108 may comprise applying a pressure of 0.01-8 bar on the transfer structure 112. In particular, the step 108 may comprise applying a pressure of 0.05-7 bar, 0.1-6 bar, 0.5-5 bar, 1-4 bar, 1.5-3 bar, 2-2.5 bar. Even more in particular, the pressure applied in the step 108 may be 0.01-1 bar or 0.01-0.1 bar. Vacuum may also be applied to ensure conformal contact between the transfer structure 112 and the second substrate. Moderate heating may also be applied for a suitable period of time. The heating may be at any suitable temperature. For example, the heating may be at a temperature of 40-120° C., 50-100° C., 75-90° C., 80-85° C. The heating may be carried out for 5 minutes-12 hours, 10 minutes-10 hours, 30 minutes-8 hours, 1-5 hours, 2-4 hours. In order to check whether there is conformal contact between the transfer structure 112 and the second substrate, a visual or optical inspection may be performed. For example, if the transfer structure 112 is in conformal contact with the second substrate, the reflectivity of the interface may be minimized.

Once the transfer structure 112 is contacted with the surface of the second substrate, the transfer structure 112 and the second substrate may be placed in a solvent to remove the film contact layer in a step 110. For example, the removing of the step 110 may comprise dissolving the film contact layer in a solvent. The solvent used for the removing of the step 110 may be any suitable solvent for the purposes of the present invention. For example, the solvent used for the removing of the step 110 may be based on the film contact layer. It would be immediately obvious to a person skilled in the art which solvent to select for removing the film contact layer in the step 110. For example, the solvent used for the removing of the step 110 may comprise a water-based or an organic-based solvent. Examples of suitable solvents are, but not limited to, hydrocarbon solvents, fluorocarbon solvents, chlorinated solvents, non-chlorinated solvents, alcohol solvents, or a combination thereof.

The step 110 may comprise heating the solvent at a temperature for a suitable period of time. The heating may be at any suitable temperature. For example, the heating may be at a temperature of 40-120° C., 50-100° C., 75-90° C., 80-85° C. The heating may be carried out for 10 seconds-1 hour, 10 seconds-30 minutes, 30 seconds-15 minutes, 1-10 minutes.

According to one particular embodiment, during the step 110, the film contact layer is dissolved in the solvent and therefore the thin film in contact with the film contact layer of the transfer structure 112 is released onto the surface of the substrate to provide the thin film 116 applied on the surface of the second substrate. Accordingly, the support layer of the transfer structure is also released separately.

According to an alternative embodiment, the support layer may be peeled off from the transfer structure 112 prior to the step 110 of the removing. When the support layer is peeled off, the thin film, in contact with the film contact layer, is released onto the surface of the substrate. Subsequently, the film contact layer may be removed according to the step 110 to obtain a second substrate having the thin film on its surface. For this alternative embodiment, it would be obvious to a person skilled in the art that the film contact layer may be of a suitable thickness to be able to support the thin film.

The thin film transferred from the first substrate to the second substrate may be patterned or unpatterned. When the thin film is unpatterned, the method 100 may further comprise a step of patterning the thin film. In particular, the method 100 may comprise a further step of patterning the thin film before or after the providing of the step 104. Any suitable patterning method may be used to pattern the thin film. For example, the thin film may be patterned by etching, lithography such as optical deep-UV lithography, X-ray lithography or electron beam lithography.

According to a particular embodiment, the thin film is patterned before the providing of the step 104. The method 100 therefore comprises a patterning step after the applying of the step 102. Any suitable method of patterning may be used to pattern the thin film applied on the surface of the first substrate. For example, the thin film may be patterned by standard photolithography methods while the thin film is on the first substrate surface before the application of the transfer structure.

According to another particular embodiment, the thin film may be patterned after the providing of the step 104. In this case, the support layer may act as the etch mask that protects the contacted regions of the thin film from the patterning such as etching. In this way, the patterns of the thin film may be self-aligned to the contact region of the support layer. An example of a method of patterning the thin film after the providing of the step 104 is as shown in c) and d) of FIG. 1(B). In FIG. 1(B), the thin film is labelled as "2D layered material", the film contact layer 202 is labelled as the "S layer" and the support layer 204 is labelled as the "E layer". In c) of FIG. 1(B), the support layer of the transfer structure is patterned. Accordingly, the transfer structure in conformal contact with the thin film applied on the surface of the first substrate and the thin film are subjected to etching by oxygen plasma using the support layer as the mask layer. In this way, the exposed film contact layer and thin film are etched by the oxygen plasma to form a patterned thin film as shown in d) of FIG. 1(B). It would be obvious to a person skilled in the art that other methods of patterning other than oxygen plasma may also be used for patterning the thin film.

According to a particular embodiment, the method of transferring a thin film from a first substrate to a second substrate is as shown in FIG. 1(B). In particular, a first copper substrate with a 2-dimensional thin graphene film applied on a surface of the copper substrate is provided at a). The graphene film may be deposited on the copper substrate surface by any suitable method, such as chemical vapour deposition. A film contact layer referred to as S layer is electro-spun on the graphene film in b). A support layer referred to as E layer is then brought into conformal contact with the film contact layer as shown in c). The support layer is patterned as shown in c). Subsequently, the graphene film is subjected to patterning by exposing the film contact layer and the graphene film to oxygen plasma. During the etching of the film contact layer and the graphene film in oxygen plasma, the support layer acts as the etchant mask. Once the graphene film is patterned, the copper substrate is dissolved in a suitable etchant bath as shown in d). Once the copper substrate is dissolved, the graphene film is in conformal contact with the support layer and the film contact layer, thereby transferred onto the transfer structure comprised of the film contact layer and the support layer. The graphene film is not free floating, and is instead supported onto the support layer via the film contact layer as shown in e). The graphene film in contact with the film contact layer and support layer is then brought into conformal contact with a clean surface of a second target substrate and aligned to the desired location on the second target substrate as shown in f). The surface of the second target substrate is pre-cleaned to be free from chemical and particulate contaminants. During the contacting of the graphene film with the surface of the second target substrate, a small pressure of about 0.1 bar is applied to ensure conformal contact is achieved. The entire assembly is then placed in a suitable release solvent in order to transfer the graphene film to the surface of the second target substrate. The release solvent dissolves the film contact layer, which therefore releases the graphene film onto the surface of the second target substrate. Accordingly, the support layer is also released. The transferred graphene film on the support of the second target substrate is as shown in g).

It can be seen that the method of transferring a thin film from one substrate to another substrate does not require peeling, bending, stretching, or warping of the thin film. Accordingly, the thin film would not be deformed or fractured during the transferring. The integrity of the transferred thin film may be determined by Raman spectroscopy, microscopy and field-effect mobility measurements. The method of the present invention is robust and may be used for large scale patterning and transferring of a thin film from one substrate to another substrate at ease in a contamination-free manner.

Further, the method of the present invention does not require the use of adhesives. In particular, the film contact layer is not an adhesive layer and therefore, the method does not require attaching the thin film to a first adhesive layer before transferring off the adhesive layer. Since the method does not use adhesives, the method is clean and prevents damage of the thin film. In particular, the method of the present invention circumvents the problems associated with transferring thin films by competitive adhesion, contamination, loss of mechanical integrity of the thin film during the transfer, and substrate incompatibility.

As mentioned above, none of the steps of the method of the present invention involves peeling, floating off or other deformation that may cause warping, stretching or bending of the thin film which would lead to the damage and fracture of the thin film. The method of the present invention therefore provides a reproducible and versatile method to transfer with high integrity thin films including single and multilayer thin films.

The method of the present invention also does not require the use of a carrier film which would be susceptible to stress and strain such as stretching, bending and warping during the transfer of the thin film. Chemical etching is also not required to release the thin film onto the second substrate. Accordingly, the method of the present invention may be used for transferring thin films to all types of substrates including metal foils, plastics such as polyimide, polyetherimide, polyester, polyethylene, polyethylene terephthalate and polystyrene, glass, silicon oxide, silicon, inorganic oxides, semiconductor surface, whether or not the substrates have pre-patterned features.

The method of the present invention may also be applied for repeated layering of thin films on the second substrate by repeating the method for a number of times as required by the number of layers desired on the second substrate.

There is also provided a device comprising a substrate having a thin film transferred onto a surface of the substrate according to the method 100. The device may be any suitable device. For example, the device may be an electronic, an optoelectronic, an optical sensor, a capacitor, an energy storage film or a thermal device. For example, the device may be a thin film transistor, a light-emitting diode, a solar battery, an ultrathin capacitor, or a bio-sensor.

Transfer Structure 200

The components of the transfer structure 200 as shown in FIG. 2(A) will now be described in more detail. As mentioned above, the transfer structure 200 comprises a film contact layer 202 and a support layer 204.

Film Contact Layer 202

When the transfer structure 200 is contacted with the thin film applied on the surface of the first substrate to provide a transfer structure and the thin film according to step 104 of the method 100, the film contact layer 202 of the transfer structure 200 may be conformal contacted with the thin film.

The film contact layer 202 may be of any suitable material. In particular, the film contact layer 202 according to the present invention may be any layer which is able to provide adequate support for the thin film during the dissolving of the first substrate of the step 106. The film contact layer 202 may mediate conformal contact between the support layer 204 and the second substrate. The film contact layer 202 may also be removed to release and thereby transfer the thin film onto a surface of the second substrate. For example, the film contact layer 202 may be dissolved to release the thin film onto the surface of the second substrate.

The film contact layer 202 may be of any suitable material which is compatible with: the solvent in the etchant bath for removing the first substrate, the second substrate, and the thin film. The film contact layer 202 may be such that it can be removed completely or almost completely during a subsequent removing step, thereby transferring the thin film onto a surface of a second substrate. The subsequent removing step may comprise dissolving the film contact layer 202.

According to a particular embodiment, the film contact layer 202 forms van der Waals bonds with the thin film when the film contact layer and the thin film are in contact during the providing of the step 104. The van der Waals bonds formed between the film contact layer 202 of the transfer structure 200 and the thin film may provide sufficient adhesion to prevent the thin film from detaching itself from the transfer structure 200 during the removing of the step 106.

The film contact layer 202 may comprise a polymer or resin material. The polymer may be an amorphous polymer. The film contact layer 202 may comprise a polymer or resin. For example, the film contact layer 202 may be, but not limited to, polystyrene (PS), polycarbonate (PC), poly(methyl methacrylate) (PMMA), polydimethylsiloxane (PDMS), polyisobutylene (PIB), or divinylsiloxane-bis-benzocyclobutene (DVS-BCB) resin. Such polymers may have good solubility in common organic solvents such as toluene, xylene, chloroform, acetone, cyclohexane, hexane, mesitylene and n-decane. Further, such polymers may be compatible with water-based etchant solvents which may be used for the step 106 of removing the first substrate and with second substrates which may be insoluble in organic solvents.

The film contact layer 202 may be a polyelectrolyte such as poly(styrene sulfonic acid), poly(styrenesulfonate), polyacrylic acid, polyacrylate, or poly(allylamine hydrochloride). Such polyelectrolytes may be suitable for non-aqueous based dissolution baths used for the step 110 to remove the film contact layer 202 and for second substrate which are compatible with water.

The film contact layer 202 may be a photoresist material such as polyimide, epoxy or novalac type resists, such as SU-8.

The film contact layer 202 may be a fluorocarbon-based polymer. Fluorocarbon-based polymers may be dissolved in fluorinated solvents and may therefore be compatible with both water and organic-based solvents used as the etchant bath for the step 106 of dissolving the first substrate. Such fluorocarbon-based polymers may also be generally compatible with materials used as the second substrate and may be inert to the thin film. The fluorocarbon-based polymer may be any one of, but not limited to, copolymers of tetrafluoroethylene and 2,2-bistrifluoromethyl-4,5-difluoro-1,3-dioxiole (for example, Teflon AF2400, AF1601, AF1300), copolymers of tetrafluoroethylene and 2,2,4-trifluoro-5-trilfuoromethoxyl-1,3-dioxole (for example, Hyflon AD), fluorinated methacrylate polymers, fluoroacrylate polymers (for example, Certonal FC732 (Acota), FluoroPel PFC 500 and 600 series (Cytonix), FluorArcyl series (Cytonix), Certonal FC722 (Acota) and Certonal FC746 (Acota)), perfluoro(1-butenyl vinyl ether) homocopolymers (for example, Cytop type A, type M and type S), copolymers of perfluoro(dioxolanes), copolymers of perfluoro(dioxolanes) and perfluorovinyl ether, or a combination thereof.

Fluorocarbon-based polymers may dissolve in fluorocarbon solvents such as: perfluoroalkanes such as perfluorohexane (Fluorinert FC-72, 3M), perfluoro(dimethylcyclobutane) (KCD 9445, Du Pont) and perfluoro (methylcyclopentane) (Flutec PP1C, Rhone-Poulenc); perfluoroethers such as perfluoro(2-butyl-tetrahydrofuran) (Fluorinert FC-75, 3M); perfluoroamines such as perfluoro-n-tributylamine (Fluorinert FC-43, 3M); or perfluoropolyethers such as propene,1,1,2,3,3,3-hexafluoro, oxidized, polymerized (Galden HT200, Ausimont) and propene,1,1,2,3,3,3-hexafluoro, oxidized, polymerized (Galden HT135, Ausimont), or halocarbons, which are compatible with most second substrates and patterns that may be present on the second substrate.

Fluorocarbon-based polymers and their solvents also have low intrinsic surface tension, which greatly assists in the wetting of the thin film. Fluorocarbon solvents also do not swell the non-fluoropolymer films, organic semiconductors, printed metal nanoinks, spin-on glass materials and photoresist materials (such as polyimides, polyethers, novalak) that may be present on the second substrate.

According to a particular embodiment, the fluorocarbon-based polymers may remain attached to the thin film even after the film contact layer 202 is removed in the step 110, thereby forming a self-assembly monolayer on the thin film.

Reactive polymers may not be suitable for use as the film contact layer 202. This is because these polymers may comprise acid groups or radical-generating groups, and may remain attached to the thin film even after the film contact layer 202 is removed in the step 110, thereby contaminating the thin film.

According to a particular embodiment, when the thin film is graphene, the film contact layer 202 may be, but not limited to, polystyrene, polycarbonate, polyisobutylene, poly (methyl methacrylate) (PMMA), divinylsiloxane-bis-benzocyclobutene resin, or polydimethylsiloxane. The suitable solvents which can be used for different film contact layers 202 for the removing of the step 110 are provided in Table 1 below.

TABLE 1

Suitable solvents to dissolve different film contact layers

| Film contact layer | Suitable solvents |
|---|---|
| polystyrene | acetone, toluene, cyclohexane, xylene, butyl acetate |
| polycarbonate | ethanol, acetone, ethyl acetate |
| polyisobutylene | hexane, n-decane |
| poly (methyl methacrylate) (PMMA) | chloroform, acetone |
| divinylsiloxane-bis-benzocyclobutene resin | mesitylene |
| polydimethylsiloxane | hexane |
| poly[4,5-difluoro-2,2-bis(trifluoromethyl)-1,3-dioxole-co-tetrafluoroethylene] (AF2400) | propene, 1,1,2,3,3,3-hexa-fluoro, oxidised, polymerise (HT200), perfluoro(2-butyl-tetrahydrofuran) (FC-75) |
| perfluoro(1-butenyl vinyl ether) homocyclopolymer (CYTOP) | perfluorotrialkylamine (CYTOP CT-SOLV 180) |

The film contact layer 202 may be of any suitable thickness. For example, the film contact layer 202 may have a thickness of about 10-5000 nm. In particular, the thickness of the film contact layer 202 may be about 50-4500 nm, 100-4000 nm, 150-3500 nm, 200-3000 nm, 300-2500 nm, 400-2000 nm, 500-1500 nm, 600-1000 nm, 700-900 nm, 750-800 nm. Even more in particular, the thickness of the film contact layer 202 may be 10-1000 nm. By having a suitable thickness of the film contact layer 202, the built-in stress within the film contact layer 202 is reduced. A thickness of more than 5000 nm may result in the build up of stress within the film contact layer 202 which may cause the warping or loss of conformal contact with the thin film and the support layer 204.

The thickness of the film contact layer 202 is much less than the thickness of carrier films used for transferring thin films in the methods of the state of the art. In particular, the thickness of the carrier films used in the methods of the state of the art may be about 200,000 nm.

Support Layer 204

The support layer 204 provides a support for the film contact layer 202 which receives the thin film during the transfer process. In particular, the support layer 204 prevents inadvertent stretching or deformation of the thin film which may cause micro-cracking and mechanical damage during the transfer of the thin film from the surface of the first substrate to the surface of the second substrate while the thin film is in contact with the film contact layer 202. For example, the support layer 204 may be a semi-rigid support layer. The support layer 204 may provide a conformal contact with the thin film by accommodating a possible small bowing or roughness of the first substrate and of the second substrate including topographic features which may be present on the second substrate. The support layer 204 may also allow proper registration of the thin film to pre-existing features of the second substrate to position and orientate the thin film at will on the second substrate.

The support layer 204 may be of any suitable material. The support layer 204 may be of any suitable material to provide the necessary support for the thin film. In particular, the support layer may comprise an elastomer. In particular, the elastomer may be a cross-linked polymer. In particular, the support layer 204 may comprise a material which may exhibit a relatively low Young's modulus and a relatively large strain to failure. The Young's modulus of the support layer 204 may be determined by the pressure present during conformal contact with the film contact layer 202 and thin film. For example, the Young's modulus of the support layer 204 may be 100 kPa-100 MPa. In particular, the Young's modulus of the support layer 204 may be 300 kPa-10 MPa, 500 kPa-5 MPa, 1-3 MPa.

For example, the elastomer may be selected from, but not limited to, poly(dimethylsiloxane), polyurethane, butadiene-acrylonitrile copolymer, perfluoroalkoxy polymers, polyethylene, poly(ethyl acrylate), polyisoprene, polybutadiene, polychloropene, or combinations thereof. In particular, the elastomer may be, but not limited to, poly(dimethylsiloxane) cross-linked with poly(hydromethylsiloxane), cross-linked polyurethane, butadiene-acrylonitrile copolymer cross-linked with poly(vinyl chloride), cross-linked perfluoroalkoxy polymers, or combinations thereof.

The support layer 204 may be patterned or unpatterned. If the support layer 204 is unpatterned, the support layer 204 may be uniform with no relief features smaller than the size of the first substrate. Accordingly, the support layer 204 will provide a conformal contact with the thin film over its entire area. If the support layer 204 is patterned, the support layer 204 will provide a conformal contact only over the protrusion regions. The support layer 204 may be patterned by any suitable method. For example, the support layer 204 may be patterned by casting into etched or photolithographically defined molds.

The support layer 204 may be of any suitable thickness. For example, the support layer may have a thickness of 100 µm-10 mm. In particular, the thickness of the support layer 204 may be about 200-9000 µm, 300-8000 µm, 400-7000 µm, 500-6000 µm, 600-5000 µm, 700-4000 µm, 800-3000 µm, 900-2000 µm, 950-1000 µm. Even more in particular, the thickness of the support layer 204 may be 1-10 mm. By having a suitable thickness of the support layer 204, a proper conformal contact may be achieved at a desired operating pressure. In particular, the operating pressure may be between 0.01 to 8 bar to achieve conformal contact with the thin film on the first substrate at the step 104 of the method 100 and subsequently with the second substrate at the step 108 during the method of 100.

The mechanical stiffness of the support layer 204 may be increased. For example, the mechanical stiffness of the support layer 204 may be increased by backing a surface of the support layer 204 opposite to the surface of the support 204 in contact with the film contact layer 202. The surface of the support layer 204 may be backed by a metal or stiff plastic sheet. However, the support layer 204 should not be made too stiff as this would not enable the support layer 204 to form a conformal contact with the thin film on the first substrate and with the second substrate surface during the step 108.

The support layer 204 may be configured by any suitable method. For example, the support layer 204 may be configured on a conveyor belt or drum for toll-to-roll transfer of the thin film. The support layer 204 may also be configured in a form similar to flexographic painting.

Method of Fabricating Transfer Structure 200

Any suitable method of fabricating the transfer structure 200 may be used for the purposes of the present invention. According to one embodiment, the transfer structure 200 may be pre-assembled prior to the contacting of the step 104. In particular, the transfer structure 200 may comprise assembling a film contact layer 202 and a support layer 204. The film contact layer 202 and the support layer 204 may be as described above.

The film contact layer 202 and the support layer 204 may be brought together by any suitable method. For example, the film contact layer 202 may be spin coated on the support layer 204. Any other suitable method may also be used such as, but not limited to, electrospinning, plating, chemical solution deposition, chemical vapour deposition, plasma-enhanced chemical vapour deposition, atomic layer deposition, thermal evaporation, electron beam evaporation, molecular beam epitaxy, sputtering, pulsed laser deposition, cathodic arc deposition, electrohydrodynamic deposition, inkjet printing, aerosol spraying, dip coating, drop casting, physical vapour deposition, vacuum sublimation, doctor blading, or a combination thereof.

According to another embodiment, the transfer structure 200 is formed on the first substrate after the applying of the step 102. In particular, once the thin film is applied on the surface of the first substrate according to step 102, a film contact layer 202 is applied on the thin film. Any suitable method of applying the film contact layer 202 may be used for the purposes of this invention. For example, the film contact layer 202 may be spin coated on the thin film. Other suitable methods may include, but not limited to, electrospinning, plating, chemical solution deposition, chemical vapour deposition, plasma-enhanced chemical vapour deposition, atomic layer deposition, thermal evaporation, electron beam evaporation, molecular beam epitaxy, sputtering, pulsed laser deposition, cathodic arc deposition, electrohydrodynamic deposition, inkjet printing, aerosol spraying, dip coating, drop casting, physical vapour deposition, vacuum sublimation, doctor blading, or a combination thereof. Once the film contact layer 202 is applied, a support layer 204 is brought into conformal contact with the film contact later 202.

Having now generally described the invention, the same will be more readily understood through reference to the following examples which are provided by way of illustration, and are not intended to be limiting.

EXAMPLES

Example 1

A film contact layer of poly[4,5-difluoro-2,2-bis(trifluoromethyl)-1,3-dioxole-co-tetrafluoroethylene] (Teflon AF2400, DuPont Fluoroproducts) dissolved in fluorocarbon solvent propene, 1,1,2,3,3,3-hexa-fluoro, oxidised, polymerise (Galden HT200, Ausimont) to a concentration of 30 mg/mL was deposited on a graphene sheet grown on copper (Cu) foil having a size of 25×25 mm to form a 200 nm overlayer and annealed briefly at 90° C. to remove any excess solvent.

A patterned piece of 20 mm (length)×20 mm (width)×3 mm (height) of poly(dimethylsiloxane) (PDMS) support layer that was slightly smaller than the copper foil was conformal contacted with the graphene sheet through the film contact layer and transferred into an oxygen plasma chamber. The film contact layer/graphene region not covered by the support layer was then etched away by oxygen plasma (110 seconds, 200 W, 600 mTorr). The entire Cu layer was then etched away by dipping the setup in aqueous nitric acid ($HNO_3$) (20 wt %, Merck) to release the support layer bearing the film contact layer in contact with the graphene. This support layer with the film contact layer and graphene was then rinsed with water to remove any metal etch residue and subsequently dried.

The support layer with the film contact layer and graphene was then conformal contacted with a second substrate of oxygen-plasma treated 300 nm thick silicon dioxide on Si. The entire assembly was then immersed in perfluoro(2-butyl-tetrahydrofuran) solvent (Fluorinert FC-75, 3M) to dissolve the bulk of the film contact layer and leave a monolayer of the film contact layer. As a result, the graphene sheet was released onto the target silicon dioxide substrate while the support layer was removed. The silicon dioxide substrate with the graphene layer deposited on its surface was then rinsed with perfluoro(butyltetrahydrofuran) (Fluorinert FC-75, 3M) solvent to remove any bulk residue of the film contact layer, and dried by briefly annealing on a hotplate at 90° C.

Figure 3:
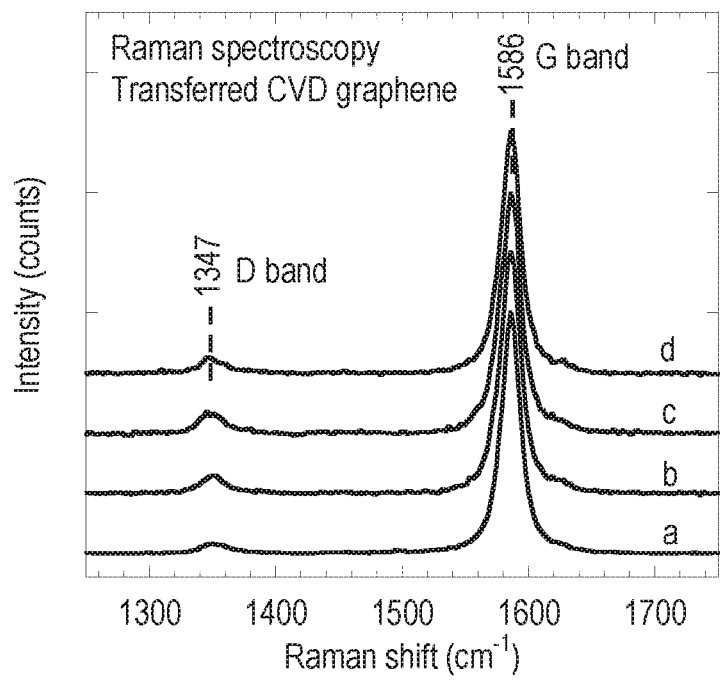
FIG. 3 shows the Raman spectroscopy of a transferred graphene film on a 300 nm $SiO_2$ substrate at different locations of the substrate.

FIG. 3 shows the Raman spectra of the transferred graphene sheet on the silicon dioxide substrate at different locations using a Renishaw In-Via Raman 2000. The intensity ratio of the D band to the G band is very low (about 0.09), which is similar to that of the initially deposited graphene on the copper substrate by chemical vapour deposition. This demonstrates the high integrity of the transfer method used in this example.

Figure 4:
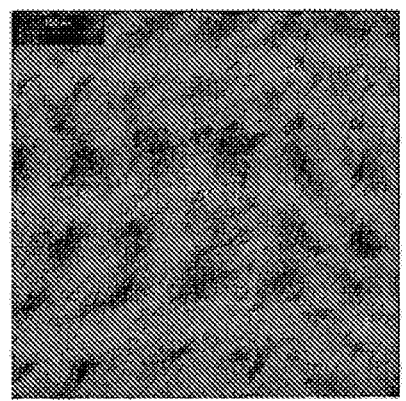
FIG. 4 is an optical image of a transferred graphene film on 300 nm $SiO_2$ substrate.
Figure 5:
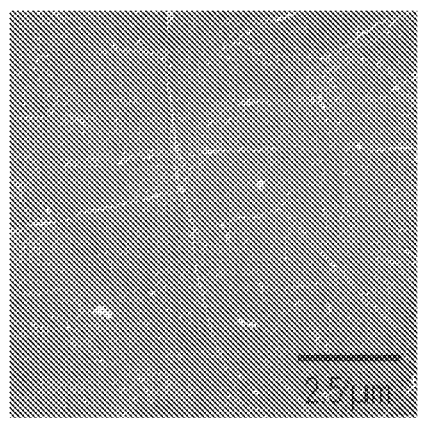
FIG. 5 shows an atomic-force microscopy of a residue-free graphene film on 300 nm $SiO_2$ substrate (z-scale is 30 nm)

FIG. 4 shows the optical image of the transferred graphene sheet. It can be seen that the transferred graphene sheet does not have any microcracks or defects. There are also no obvious residues of the film contact layer or support layer found on the transferred sheet, as can be seen from the atomic-force microscopy results of FIG. 5.

Example 2

The method described in Example 1 was repeated, except that the solvent used for dissolving the film contact layer was propene,1,1,2,3,3,3-hexafluoro, oxidised, polymerised (Galden HT-200, Ausimont).

Example 3

The method described in Example 1 was repeated, except that the film contact layer was 30 nm thick polystyrene having a molecular weight of 10,000 (Sigma Aldrich). $FeCl_3$ (0.5M, Sigma-Aldrich) was used to dissolve the first substrate. The support layer with the film contact layer and graphene was then conformal contacted with a second substrate of oxygen plasma treated 300 nm thick silicon dioxide on Si. The entire assembly was then immersed in xylene (Fisher Scientific) to dissolve the film contact layer. As a result, the graphene film was released onto the surface of the target silicon dioxide substrate while the support layer was removed. The silicon dioxide substrate with the graphene layer deposited on its surface was then rinsed with xylene to remove any residue of the film contact layer, and dried by briefly annealing on a hotplate at 90° C.

Example 4

The method described in Example 3 was repeated, except that the solvent used for dissolving the film contact layer was toluene (Fisher Scientific).

Example 5

The method described in Example 3 was repeated, except that the solvent used for dissolving the film contact layer was acetone (J T Baker).

Example 6

The method described in Example 3 was repeated, except that the film contact layer was divinylsiloxane-bis-benzocyclobutene resin (CYCLOTENE XU 71918.30 Resin, Dow Chemical Company) and the solvent used for dissolving the film contact layer was mesitylene (Sigma-Aldrich).

Example 7

The method described in Example 6 was repeated, except that the solvent used for dissolving the film contact layer was hexane (Fischer Scientific).

Example 8

The method described in Example 3 was repeated, except that the film contact layer was poly(dimethylsiloxane) resin (Sylgard 184 silicone elastomer base, Dow Corning Corporation) and the solvent used for dissolving the film contact layer was hexane (Fisher Scientific).

Example 9a

Polyisobutene (FIB) (Product code P3846A-IB, Polymer Source, Inc.) was dissolved in n-decane (HPLC, Sigma-Aldrich) to a concentration of 60 mg/mL PIB and was deposited on a graphene sheet grown on a copper (Cu) foil to form a 1 μm film contact layer. The film contact layer was annealed at 100° C. for 5 minutes to remove any excess n-decane. A support layer comprising poly(dimethylsiloxane) (PDMS) that was slightly smaller than the graphene/Cu sheet was conformal contacted with the graphene sheet through the PIB film contact layer. The entire assembly was placed on a petri dish with the PDMS support layer facing down and transferred into a oxygen plasma chamber (600 seconds, 600 W, 470 mTorr) to etch off the underside graphene and also the region which was not covered by the PDMS support layer.

Subsequently, the entire Cu sheet was etched away by dipping in $FeCl_3$ solution (0.5M, Sigma-Aldrich) leaving the support layer with the film contact layer and the graphene in contact with the film contact layer (PDMS/PIB/graphene assembly) in the $FeCl_3$ solution. The PDMS/PIB/graphene assembly was then rinsed with water to remove any copper residue and dried.

The PDMS/PIB/graphene assembly was then conformal contacted with a second substrate of oxygen-plasma treated 300-nm-thick silicon oxide on Si. The entire assembly was then immersed in n-decane to dissolve the PIB film contact layer. Accordingly, the graphene sheet was released onto the target silicon oxide substrate and the PDMS support layer was removed. The target silicon oxide substrate with the graphene layer on its surface was then further rinsed with n-decane solvent to remove PIB residues, if any.

Example 9b

Polyisobutene (FIB) (Product code P3846A-IB, Polymer Source, Inc.) was dissolved in n-decane (HPLC, Sigma-Aldrich) to a concentration of 60 mg/mL PIB and was deposited on a graphene sheet grown on a copper (Cu) foil to form a 1 μm film contact layer. The PIB/graphene/Cu assembly was annealed at 100° C. for 5 minutes to remove any excess n-decane. A support layer comprising poly(dimethylsiloxane) (PDMS) that was slightly smaller than the PIB/graphene/Cu sheet was conformal contacted with the graphene sheet through the PIB film contact layer. The entire assembly was flipped, placed on a petri dish with the PDMS support layer facing down and transferred into an oxygen plasma chamber (600 seconds, 600 W, 470 mTorr) to etch off the underside graphene and also the region which was not covered by the PDMS support layer.

Subsequently, the entire Cu sheet was etched away by dipping in $FeCl_3$ solution (0.5M, Sigma-Aldrich) leaving the PDMS/PIB/graphene assembly in the $FeCl_3$ solution. The PDMS/PIB/graphene assembly was then rinsed with water to remove any copper residue and dried.

The PDMS/PIB/graphene assembly was then conformal contacted with a second substrate of oxygen-plasma treated 300-nm-thick silicon oxide on Si. The PDMS was then peeled off from the PDMS/PIB/graphene assembly. The PIB/graphene/second substrate was then immersed in n-decane to dissolve the PIB film contact layer. Accordingly, the graphene sheet was released onto the target silicon oxide substrate. The target silicon oxide substrate with the graphene layer on its surface was then further rinsed with n-decane solvent to remove PIB residues, if any.

Example 10

The method described in Example 9 was repeated, except that the film contact layer was polyisobutylene polymer film (Product code P8883A-IB, Polymer Source, Inc.). Further, the graphene sheet was spin-coated on the copper substrate with 120 mg/mL PIB in n-decane (HPLC, Sigma-Aldrich) to form a 850 nm thick film. The PIB/graphene area on the copper substrate that was not covered by the PDMS support layer was then etched by oxygen plasma (540 seconds, 600 W, 470 mTorr).

Example 11

The method described in Example 9 was repeated, except that the film contact layer was polyisobutylene polymer film of a lower molecular weight (Product code P4185-IB, Polymer Source, Inc.). Further, the graphene sheet was spin-coated on the copper substrate with 250 mg/mL PIB in n-decane (HPLC, Sigma-Aldrich) to form a 1350 nm thick film. The PIB/graphene area on the copper substrate that was not covered by the PDMS support layer was then etched by oxygen plasma (780 seconds, 600 W, 470 mTorr).

Example 12

The methods described in Examples 9, 10 and 11 were repeated, except that the solvent used for dissolving the film contact layer was toluene (Fisher Scientific).

Example 13

The methods described in Examples 9, 10 and 11 were repeated, except that the solvent used for dissolving the film contact layer was mesitylene (Sigma-Aldrich).

Example 14

The methods described in Examples 9, 10 and 11 were repeated, except that the solvent used for dissolving the film contact layer was chlorobenzene (Sigma-Aldrich).

Example 15

The methods described in Examples 9, 10 and 11 were repeated, except that the solvent used for dissolving the film contact layer was hexane (Fisher Scientific).

Example 16

The methods described in Examples 9, 10 and 11 were repeated, except that the solvent used for dissolving the film contact layer was squalane (Sigma-Aldrich).

Example 17

The method described in Example 1 was repeated, except that the copper substrate was etched by 0.5 M filtered $FeCl_3$ (Sigma-Aldrich).

Example 18

The method described in Example 1 was repeated, except that the graphene was transferred onto silicon oxide substrates which underwent different surface treatments. Each of the silicon oxide substrates had undergone the following surface treatments: hexamethyldisilazane (HDMS)-treatment, octadecyltrichlorosilane (OTS)-treatment and trichloro(1H,1H,2H,2H-perfluorooctyl)silane-treatment, respectively.

This demonstrates the versatility of the method to transfer graphene onto oxides and other hard inorganic substrates.

Example 19

The method described in Example 1 was repeated, except that the graphene was transferred onto borosilicate glass or fused silica substrate and sapphire substrate, respectively, which underwent different surface treatments. Each of the borosilicate glass substrate or fused silica substrate substrates had undergone the following surface treatments: hexamethyldisilazane (HDMS)-treatment, octadecyltrichlorosilane (OTS)-treatment and trichloro(1H,1H,2H, 2H-perfluorooctyl)silane treatment, respectively.

Figure 6:
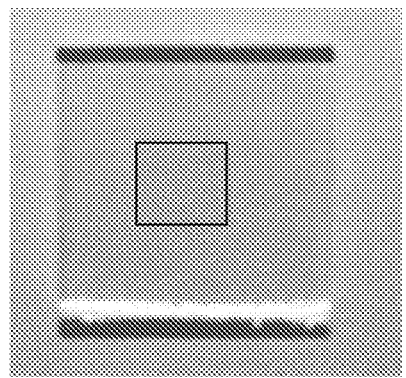
FIG. 6 shows a picture of a transferred graphene film (3.5×3.5 mm square, outline shown by black lines) on a 12×12 mm borosilicate glass substrate.
Figure 7:
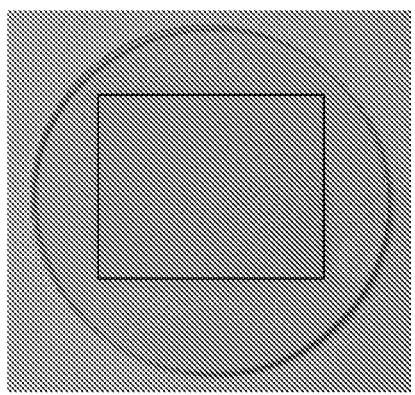
FIG. 7 shows a picture of a transferred graphene film (15×16 mm rectangle, outline shown by black lines) on a sapphire of 1 inch in diameter.

A picture of the film transferred onto the borosilicate glass substrate and sapphire substrate is shown in FIGS. 6 and 7, respectively. This demonstrates the versatility of the method to transfer graphene onto oxides and other hard inorganic substrates.

Example 20

Figure 8:
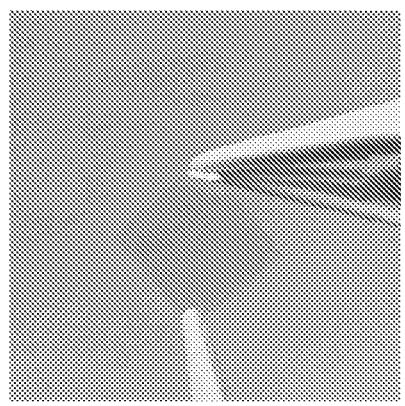
FIG. 8 shows a picture of a transferred graphene film (10.5×10.5 mm square) on a 12×12 mm PET substrate.

The method described in Example 1 was repeated, except that the graphene was transferred onto a polyethylene tetrephthalate (PET) flexible substrate. A picture of the film transferred onto the substrate is as shown in FIG. 8. This demonstrates that the method may also be used for transferring graphene onto flexible substrates.

Example 21

The method described in Example 1 was repeated, except that the graphene was transferred onto insulating polymer films. In particular, the graphene was transferred onto a poly[4,5-difluoro-2,2-bis(trifluoromethyl)-1,3-dioxole-co-tetrafluoroethylene] (AF2400, DuPont Fluoroproducts) film, perfluoro(1-butenyl vinyl ether)homocyclopolymer (CYTOP Type M, Asahi Glass) film, polystyrene (PS) film, polycarbonate (PC) film and poly(methyl methacrylate) (PMMA) film.

This demonstrates that the method may also be used for transferring graphene onto soft polymer insulating thin films.

Example 22

The methods described in Examples 3 and 9 were repeated, except that the graphene was transferred onto organic semiconducting conjugated polymer films. In particular, the graphene was transferred onto poly(9,9-dioctyl-fluorene-alt-benzothiadiazole) (F8BT), supergreen poly[2-methoxy-45-(phenyl-4,8-dimethylnonaneaoxy)-1,4-phenylenevinylene-co-poly[54 phenyl-4,8-dimethylnonaneaoxy]-1,4phenylenevinylene], poly(2-(3',7-dimethyloctyloxy)-5-methoxy-1,4-phenylene-vinylene) (OC1C10-PPV), polydiketopyrrolopyrrole (PDPP) and poly (2,5-bis(3-alkyl-thiophen-2-yl)thieno[3,2-b]thiophene) (PBTTT).

Figure 9:
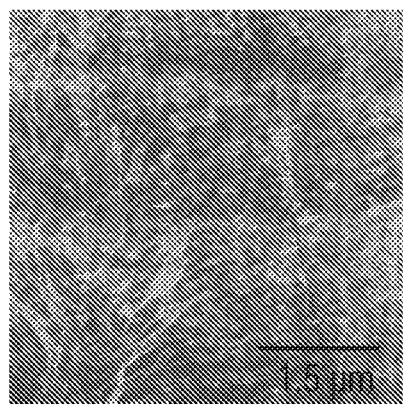
FIG. 9 shows an atomic-force microscopy showing a transferred graphene film on PBTTT (z-scale is 20 nm)

The atomic-force microscopy showing residue-free transferred graphene on PBTTT thin film is shown in FIG. 9 (z-scale is 20 nm). Graphene is identified by the grain boundaries after transfer.

This demonstrates the versatility of this method to transfer graphenes onto soft polymer films to incorporate graphene sheets at controlled locations in devices.

Example 23

The methods described in Examples 3 and 9 were repeated, except that the graphene was transferred onto poly(3,4-ethylenedioxythiophene):poly(styrene-sulfonic acid) film. Another film of poly(3,4-ethylenedioxythiophene):poly(styrene-sulfonic acid) film was deposited over the graphene followed by another graphene being transferred onto the poly(3,4-ethylenedioxythiophene):poly(styrene-sulfonic acid) film.

Figure 10:
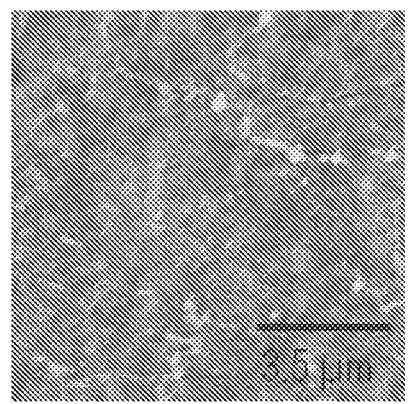
FIG. 10 shows an atomic-force microscopy showing a transferred graphene film on PEDT:PSSH (z-scale is 30 nm)

The atomic-force microscopy showing residue-free transferred graphene on PEDT:PSSH thin film is shown in FIG. 10 (z-scale is 30 nm). Graphene is identified by the grain boundaries after transfer.

This demonstrates the feasibility of fabricating multi-layered composite materials by repeated transfers of the graphene sheet optionally sandwiching a second material. These structures may be useful as supercapacitors and other forms of energy-storage films.

Example 24

The method described in Example 3 was repeated, except that a first graphene film was transferred onto polycarbonate (PC) or poly(methyl methacrylate) (PMMA) film. Another film of PC or PMMA is then spun over the transferred graphene film. Subsequently, a second graphene film was transferred onto the second PC or PMMA film. The process is repeated for up to three graphene layers.

Figure 11:
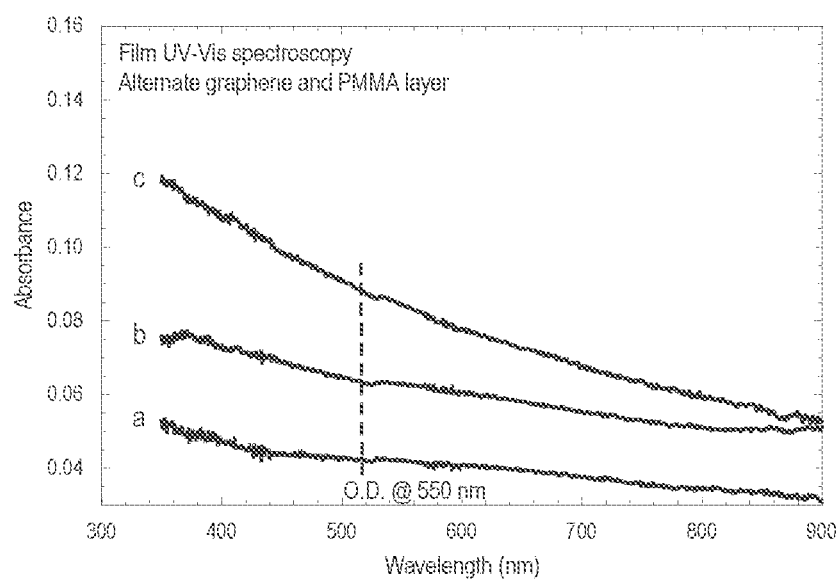
FIG. 11 shows the film UV-Vis spectroscopy of alternating graphene/PMMA stacked film on a spectrosil, (a) denotes transferred single layer graphene, (b) denotes another stack of graphene/PMMA on (a), (c) denotes another stack on (b)

This demonstrates the feasibility of fabricating multi-layered composite materials by repeated transfers of the graphene film optionally sandwiching a second material. UV-Vis spectroscopy with decreasing optical transparency for each additional graphene layer is illustrated in FIG. 11. The UV absorbance is measured at 550 nm and each layer of graphene absorbs about 2% at this wavelength.

Example 25

Figure 12:
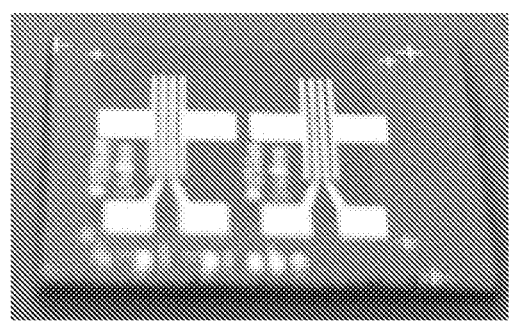
FIG. 12 shows a picture of a transferred graphene film onto two shadow-evaporated 4-in-1 point Au bar electrodes evaporated on 300 nm $SiO_2$ substrate.

The method described in Example 3 was repeated, except that the graphene was transferred onto 250 μm channel length and 4.8 mm channel width 4-point probe source-drain electrodes (7 nm thick Cr/50 nm Au) evaporated on 300 nm thick silicon oxide substrate. A picture showing the transferred graphene on a patterned Au source-drain electrode evaporated on the $SiO_2$ substrate is shown in FIG. 12.

Example 26

The methods described in Examples 1, 3 and 9 were repeated, except that the graphene on the copper substrate was of different sizes from micrometers to centimetres.

Example 27

Figure 13:
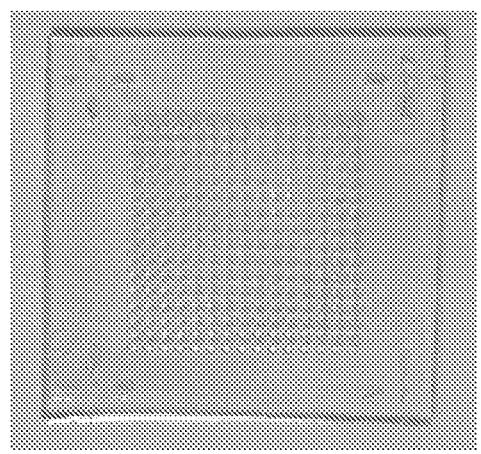
FIG. 13 shows a picture of a patterned SU-8 template of 2×2 inch with a diameter resolution of 500 µm.

Patterned PDMS support layer was fabricated as follows. A SU-8 (MicroChem Corporation) template for micromolding the PDMS support layer was first fabricated. A glass substrate was treated using hexamethyldisilazane before casting a 1 mm thick SU-8-2150 (negative radiation sensitive resist, MicroChem Corporation). A uniform SU-8 thick film was then obtained by soft-baking at 65° C. for 10 minutes followed by at 95° C. for 2 hours to allow reflow and drying of the film. A relaxation time of 10 minutes was allowed before the post-exposure bake was conducted at 65° C. for 5 minutes followed by at 95° C. for 30 minutes to reduce film stress. A final hard-bake was carried out at 120° C. for 4 hours before another relaxation of 10 minutes. The SU-8 mold was formed by overlaying a desired plastic patterned mask on the SU-8 film and exposed to 365 nm UV light (3 minutes, 365 nm, handheld 39 W lamp at a distance of 10 cm) and developed with SU-8 developer (1-Methoxy-2-propyl acetate, MicroChem Corporation) with slight agitation. The SU-8 template, as shown in FIG. 13, was then rinsed with iso-propyl alcohol and $N_2$-blown dry. To make the PDMS support layer, 10:1 w/w % of Sylgard 184 silicon elastomer base and Sylgard 184 silicon elastomer curing agent (Dow Corning Sylgard 184 silicone elastomer) was mixed and degassed in a vacuum desiccator at $10^{-2}$ mbar until no bubbling was observed before pouring onto an octadecyltrichlorosilane (OTS)-treated SU-8 mold that was secured level with wax in a petri dish. The dish was then transferred to a vacuum oven to further pump and heat to 75° C. overnight to cure and harden the PDMS support layer without compromising on its flexibility. The SU-8 mold together with the molded PDMS support layer was then removed and the patterned support layer was separated by peeling off the SU-8 mold. Remaining PDMS in petri-dishes were stored under vacuum before the next use to degas the PDMS as much as possible so as not to allow out-gassing during the annealing step when it was placed in conformal contact with the film contact layer.

Example 28

Figure 14:
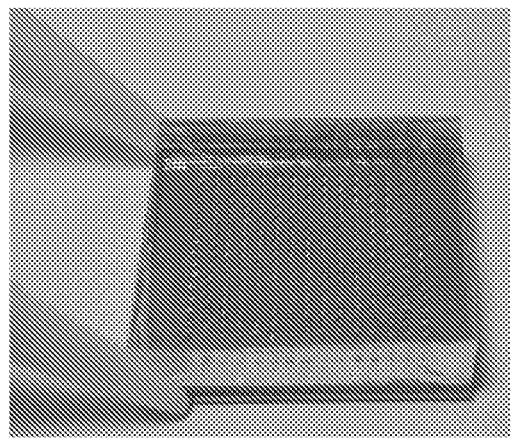
FIG. 14 shows a picture of a patterned PDMS support layer with a pillar diameter resolution of 500 µm on a 300 nm $SiO_2$ substrate.

The method described in Example 27 was repeated, except that the PDMS support layer fabricated was a circular patterned PDMS support layer with a diameter resolution of 500 μm. The patterned support layer obtained is as shown in FIG. 14.

Example 29

Figure 15:
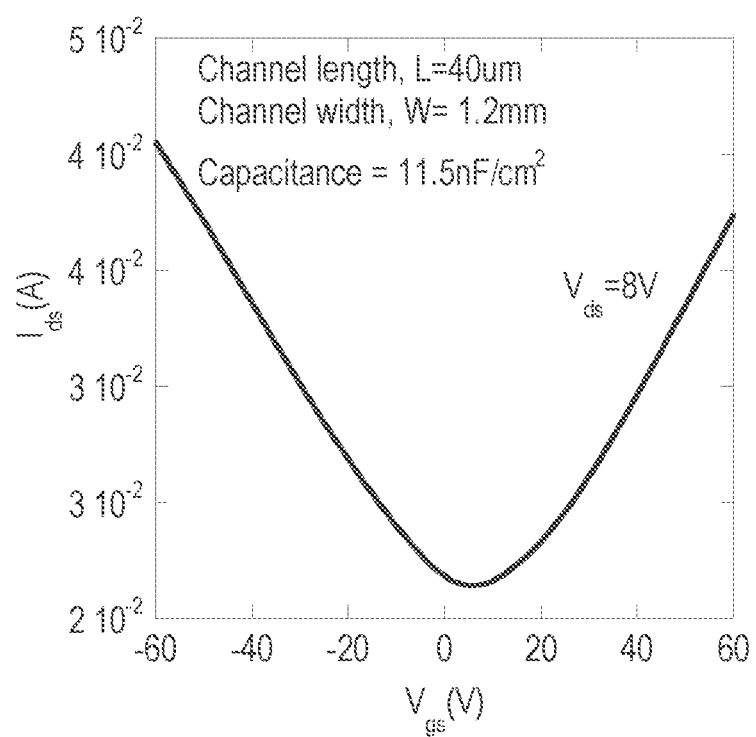
FIG. 15 shows a transfer curve of the transferred graphene field-effect transistor obtained in a single gate sweep.
Figure 16:
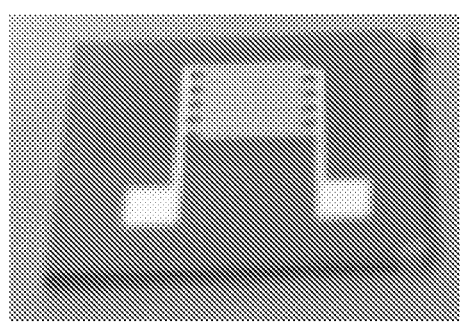
FIG. 16 shows a picture of a transferred graphene film on a photolithographically defined interdigitated Au/Cr source-drain electrodes on 300 nm $SiO_2$ gate dielectric on Si gate.

The method described in Example 3 was repeated except that the graphene was transferred onto a 300 nm thick silicon oxide substrate with Si as bottom gate and was contacted with 7 nm thick Cr and 50 nm thick Au source-drain electrodes evaporated through a shadow mask with channel length of 40 microns. A typical transfer curve obtained from single gate sweep is shown in FIG. 15. A linear hole and electron field-effect mobilities of 190 and 200 $cm^2/Vs$, respectively, were obtained. The high mobility and linearity of the transfer curve together with zero gate-voltage shifts indicate high-quality of the transferred graphene suitable for electronic-grade applications. The transfer curve is also well behaved with no hysteresis, indicating well-defined charge-carrier mobilities with no trapping and negligible contact resistance. The gate threshold is less than 10 V indicating no incidental doping by impurities. This demonstrates that the graphenes transferred by the method of this invention is clean and suitable for electronic applications. The graphene can also be transferred to a photolithographically defined Cr/Au source array, as shown in FIG. 16. This demonstrates the transfer method is compatible with underlying structures on the target substrate.

Example 30

Ultrathin Capacitor

Figure 17:
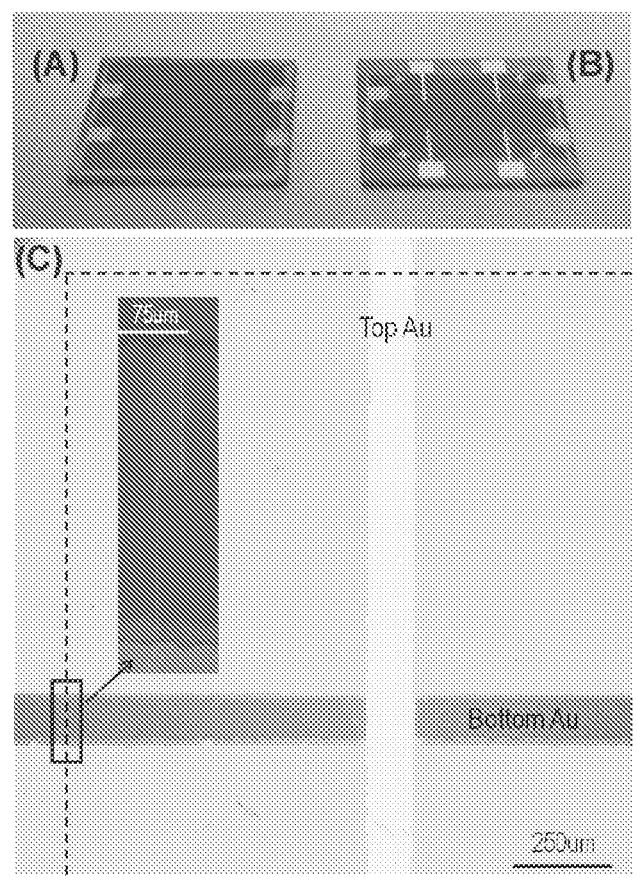
FIG. 17 shows a picture of a transferred graphene film on a 50 nm BCB film on shadow-evaporated bottom Au electrode (A) and shadow-evaporated top Au electrode (B); (C) shows an optical image of the device where the dotted line defines the boundary of which is covered by the transferred graphene.

A bottom Au electrode (7 nm/50 nm thick Cr/Au) was shadow-evaporated onto 300 nm-thick $SiO_2$/Si substrate. 50 nm-thick BCB polymer gate dielectric film was spin-coated from mesitylene solution onto this substrate. Single-layer graphene was then transferred using the method in Example 3 to form the barrier layer, as shown in FIG. 17. A top Au electrode (7 nm/50 nm thick Cr/Au) was then shadow-evaporated to form a diode structure. A I-V was measured to obtain the gate breakdown strength of this polymer gate dielectric film.

This demonstrates the feasibility of graphene as barrier layer for ultra-thin polymer film.

Example 31

Top-Gate Electrode in Thin Film Transistor

Figure 18:
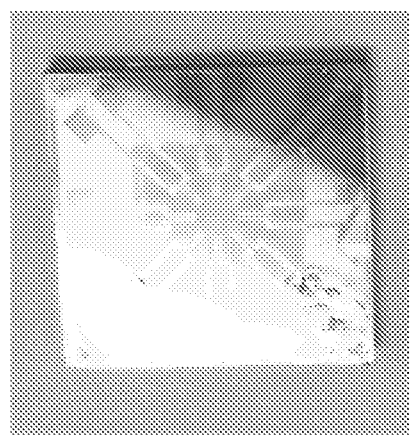
FIG. 18 shows a picture of a transferred graphene film on a 150 nm PS/40 nm PBTTT film spin coated on eight photolithographically defined bar Au/Cr source-drain electrodes on a glass substrate. An enlarged segment of the rectangle parameter shows a distinct edge of the transferred graphene across the underlying PS/PBTTT/bottom Au/Cr electrode.

A bottom interdigitated Au-source-drain electrode (7 nm/50 nm thick Cr/Au) was shadow-evaporated onto glass substrate. 10 mg/mL PBTTT in chlorobenzene was spin-coated on this substrate to form a 40-nm-thick PBTTT semiconducting polymer layer. 31 mg/mL PS in butylacetate was then spin-coated on top of this PBTTT semiconducting film to form an overlayer of 150 nm-thick PS gate dielectric polymer film. Single-layer graphene was then transferred using the method described in Example 9 to form the graphene gate electrode, as shown in FIG. 18. A full p- and n-gate voltage sweep from 0 to −30V and back to 0V and then from 0 to 30V and back to 0V and a source-drain voltage of 8V was applied to obtain a field-effect transfer curve. This demonstrates the feasibility of using graphene as a gate electrode for top gate thin film transistor.

Whilst the foregoing description has described exemplary embodiments, it will be understood by those skilled in the technology concerned that many variations in details of design, construction and/or operation may be made without departing from the present invention.

The invention claimed is:

1. An adhesive-free method of transferring a thin film from a first substrate to a second substrate comprising the steps of:
    (a) providing a transfer structure, wherein the transfer structure comprises a support layer and a film contact layer, and wherein the support layer comprises an elastomer and has a Young's modulus of 300 kPa-10 MPa, the elastomer being selected from a group consisting of: poly(dimethylsiloxane), polyurethane, butadiene-acrylonitrile copolymer, perfluoroalkoxy polymers, polyethylene, poly(ethyl acrylate), polyisoprene, polybutadiene, polychloropene, and combinations thereof;
    (b) providing a thin film on a surface of a first substrate;
    (c) contacting the film contact layer of the transfer structure with the thin film;
    (d) removing the first substrate to obtain the transfer structure with the thin film in contact with the film contact layer;
    (e) supporting the thin film on the film contact layer with the support layer which the thin film is in contact with the film contact layer after step (d) and prior to step (f);
    (f) contacting the transfer structure after step (e) with a surface of a second substrate;
    (g) removing the film contact layer and the support layer, wherein the removing comprises dissolving the film contact layer; and
    (h) obtaining the thin film on the surface of the second substrate after step (g), wherein steps (a) through (h) are performed without use of adhesives.

2. The method according to claim 1, wherein the thin film is one or more film with each film having a thickness of an atomic, molecular, or ionic layer.

3. The method according to claim 1, wherein the support layer is released before or during the removing of the film contact layer.

4. The method according to claim 1, wherein the thin film is selected from a group consisting of: graphene, boron nitride (BN), molybdenum disulfide ($MoS_2$), molybdenum-sulphur-iodine (MoSI), molybdenum (V) telluride ($MoTe_2$), niobium (IV) telluride ($NbTe_2$), nickel selenide ($NiSe_2$), tungsten disulfide ($WS_2$), copper (Cu), gold (Au), silver (Ag), platinum (Pt), palladium (Pd), silicon (Si), gallium arsenide (GaAs), indium gallium arsenide (InGaAs), copper indium gallium arsenide, yttrium barium copper oxide, strontium titanate ($SrTiO_3$), cadmium telluride (CdTe), gallium indium phosphide (GaInP), alumina ($Al_2O_3$), and combinations thereof.

5. The method according to claim 1, wherein the thin film is patterned.

6. The method according to claim 5, wherein the support layer is patterned.

7. The method according to claim 1, wherein the support layer has a thickness of 100 μm-10 mm.

8. The method according to claim 1, wherein the film contact layer comprises a polymer.

9. The method according to claim 8, wherein the polymer is selected from a group consisting of: polystyrene, polycarbonate, poly(methyl methacrylate), polydimethylsiloxane, polyisobutylene, divinylsiloxane-bis-benzocyclobutene resin, poly(styrene sulfonic acid), polyacrylic acid, poly (allylamine hydrochloride), polyimide, copolymers of tetrafluoroethylene and 2,2-bistrifluoromethyl-4,5-difluoro-1,3- dioxiole, fluorinated methacrylate polymers, fluoroacrylate polymers, perfluoro(1-butenyl vinyl ether) homocopolymer, and a combination thereof.

10. The method according to claim 1, wherein the film contact layer has a thickness of 10-5000 nm.

11. The method according to claim 1, wherein the contact of the thin film with the film contact layer is by van der Waals interaction.

12. The method according to claim 1, wherein the thin film is provided on the surface of the first substrate by electrospinning, spin coating, plating, chemical solution deposition, chemical vapour deposition, plasma-enhanced chemical vapour deposition, atomic layer deposition, thermal evaporation, electron beam evaporation, molecular beam epitaxy, sputtering, pulsed laser deposition, cathodic arc deposition, electrohydrodynamic deposition, inkjet printing, aerosol spraying, dip coating, drop casting, physical vapour deposition, vacuum sublimation, doctor blading, and a combination thereof.

13. The method according to claim 1, wherein the second substrate is a rigid or flexible substrate.

14. The method according to claim 1, wherein the second substrate is patterned.

15. The method according to claim 1, further comprising a step of patterning the thin film before or after the providing of step (a).

16. The method according to claim 1, wherein the contacting of step (f) comprises applying a pressure of 0.01-8 bar on the transfer structure.

17. The method according to claim 1, wherein the second substrate is comprised in a thin film device.

18. The method according to claim 1, wherein supporting the thin film on the film contact layer with the support layer while the thin film is in contact with the film contact layer comprises preventing stretching or deformation of the thin film.

19. The method according to claim 1, wherein supporting the thin film on the film contact layer with the support layer while the thin film is in contact with the film contact layer comprises preventing mechanical damage to the thin film using the support layer after step (d) and prior to step (f).

* * * * *